United States Patent [19]
Meyer

[11] 3,973,197
[45] Aug. 3, 1976

[54] PEAK DETECTOR

[75] Inventor: Walter E. Meyer, Royal Oak, Mich.

[73] Assignee: Koehring Company, Milwaukee, Wis.

[22] Filed: July 22, 1974

[21] Appl. No.: 490,913

[52] U.S. Cl. ............................ 324/103 P; 324/99 D
[51] Int. Cl.[2]......................................... G01R 19/04
[58] Field of Search........... 324/103 P, 103 R, 99 R, 324/99 D; 307/235 A

[56] References Cited
UNITED STATES PATENTS

| | | | |
|---|---|---|---|
| 3,421,083 | 1/1969 | Bosworth et al. | 324/99 R |
| 3,502,980 | 3/1970 | Baggott | 324/103 R |
| 3,593,133 | 7/1971 | Wisner | 324/103 R |
| 3,600,565 | 1/1969 | Forbes, Sr. | 324/103 P |

Primary Examiner—R. V. Rolinec
Assistant Examiner—Ernest F. Karlsen
Attorney, Agent, or Firm—Whittemore, Hulbert & Belknap

[57] ABSTRACT

Structure for and a method of detecting peaks in an electric signal comprising circuits for and the steps of converting a selected one of a plurality of analog signals into a current digital signal, comparing the developed digital signal with a digital signal previously developed from the selected analog signal and stored, and replacing the previously developed and stored digital signal with the current digital signal when the current digital signal is greater than the previously developed and stored digital signal and of the same polarity, and providing for readout of the currently stored digital signal in either analog or digital form.

Direct reading of the digital output in terms of standard engineering units is provided for. Also, the analog input signal may be directly read at the output of the peak detector and the peak detector may be utilized as a volt meter with a direct current signal passed directly into a digital output portion of the peak detector. The peak detector may be operated automatically or manually and upper and lower peak signals may be reset manually.

9 Claims, 7 Drawing Figures

PEAK DETECTOR

BACKGROUND OF THE INVENTION

1. Field of the Invention

The invention relates to peak detection and refers more specifically to means for and a method of detecting either or both of the positive or negative peaks of an analog signal by first converting the analog signal into a current digital signal, comparing the current digital signal with previously developed and stored digital signals representing previous peaks in the analog signal and exchanging the current digital signal for the previously stored digital signals in response to the current digital signal having a predetermined relationship with the previously stored digital signals to establish new stored digital signals representing new peaks in the analog signal, which stored digital signals may be buffered into a computer or may be read out either as analog signals or as digital signals in standard engineering units.

2. Description of the Prior Art

In the past, peak detection of analog signals has been accomplished by a plurality of means and methods, both crude and sophisticated. Most of the sophisticated peak detection structures and methods utilize a sample and hold principle wherein an analog signal is sampled, the sample is analyzed to determine if the sample indicates a new peak has been reached and if it has, the new peak is stored for either display or output on request. Subsequently, another sample is taken and the process is reaeated. Such prior structures have been relatively slow operating and cannot hold the peak for an indefinite time without drift and therefore are not as accurate as desired. Further, such structures have in the past often been complicated and therefore expensive to manufacture and sometimes inefficient in use.

SUMMARY OF THE INVENTION

In accordance with the invention, there is provided a peak detector for use in a method of determining either or both the positive and negative peaks of an analog signal, which peak detector is substantially digital in operation. Peak detection in accordance with the method of the invention includes first converting a selected alternating signal into a current digital signal which may be filtered if desired, comparing the current digital signal with stored, previously developed digital signals, and when the current digital signal has a predetermined relation with one of the stored digital signals, replacing the one stored signal with the current digital signal as a new positive or negative peak of the analog input signal.

The conversion, comparison and replacing is conducted continuously in accordance with a timing cycle which provides waiting periods to assure that the conversion is complete before a comparison is accomplished and to ensure the comparison is complete before a replacement is effected. The replacement of a stored digital signal by a current digital signal may be accomplished periodically automatically at a variable rate or may be accomplished on computer command or manually in addition to being accomplished each time a new peak is detected.

The peak detection thus accomplished may be displayed in either an analog form or in a digital form. When the digital form is used, standard engineering units for display may be selected in accordance with the invention. The output of the peak detection may also be buffered into a computer complex, if desired. Also, the input analog signal, in accordance with the invention, may be provided directly to the digital output of the peak detection structure for display in standard engineering units, and the peak detection structure may be used as a volt meter for a direct current input which would have a digital display in standard engineering units.

DESCRIPTION OF THE PREFERRED EMBODIMENT

Figure 1:
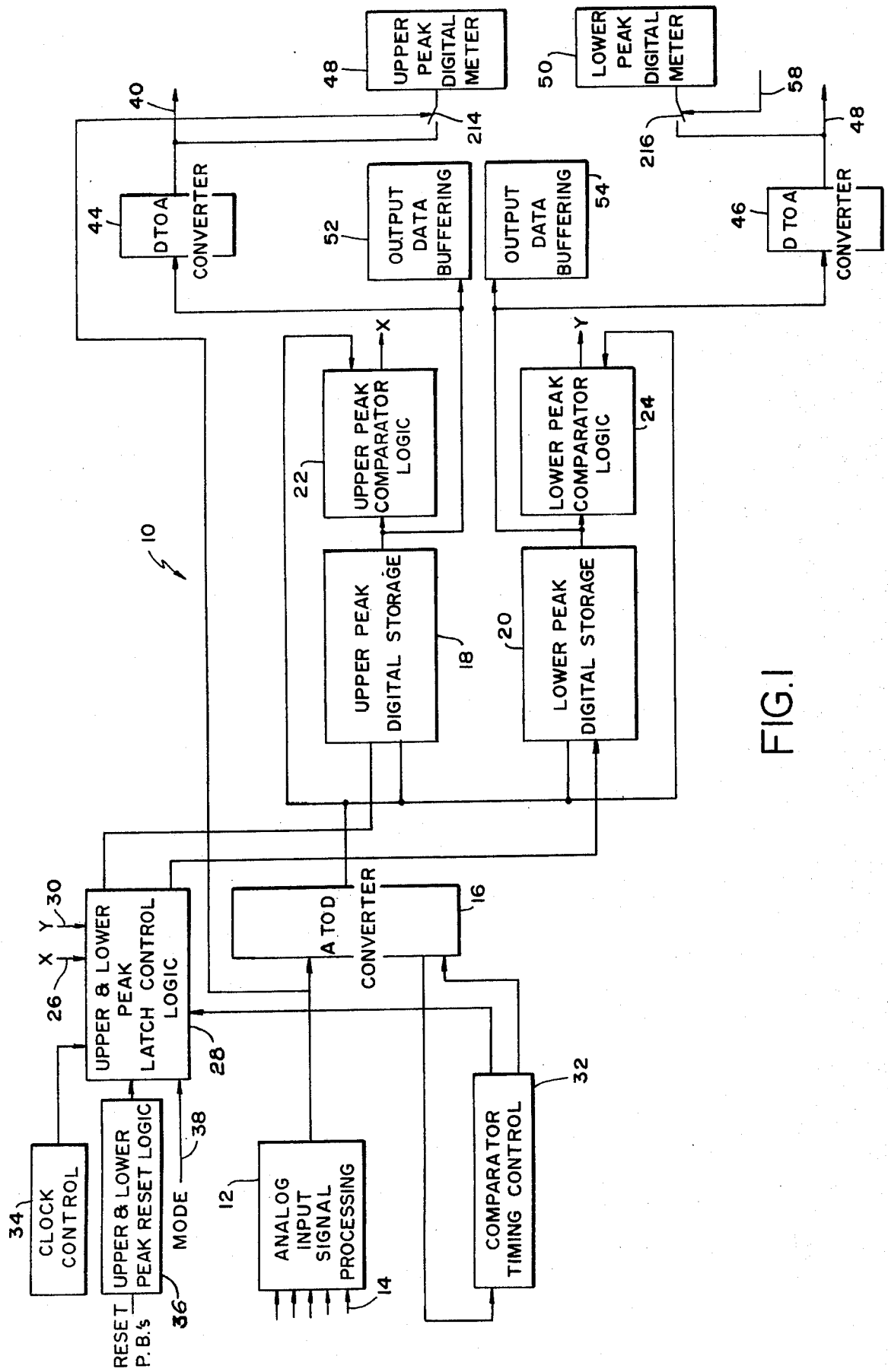
FIG. 1 is a block diagram of peak detector structure constructed in accordance with the invention for effecting the peak detection method of the invention.
Figure 2:
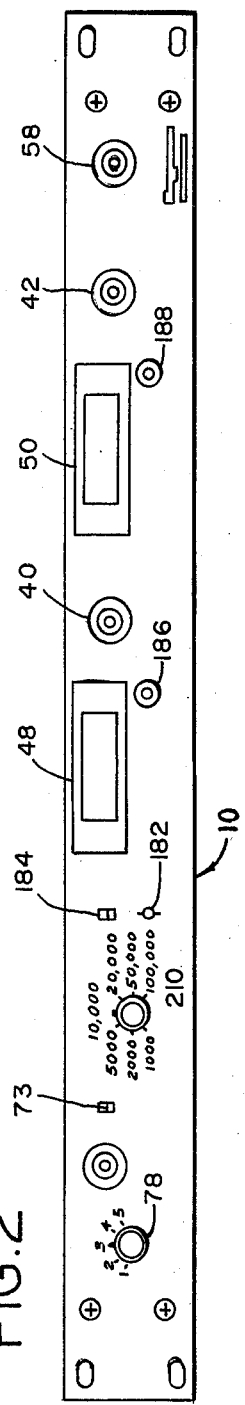
FIG. 2 is a front view of the peak detector structure of the invention.
Figure 3:
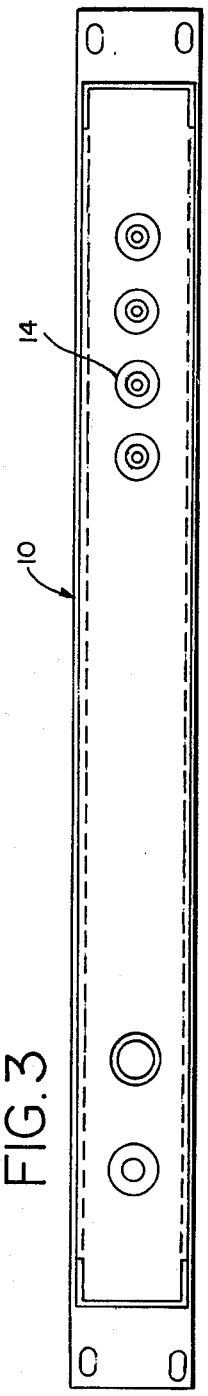
FIG. 3 is a rear view of the peak detector structure of the invention.

As shown in FIG. 1, the peak detector structure 10 includes an analog input signal processing circuit 12 for selecting and processing one of a plurality of analog input signals from conductors 14 and passing them to an analog to digital converter 16. The selected analog input signal is converted in the converter 16 to a digital signal which is then presented at the upper peak digital storage circuit 18 and the lower peak digital storage circuit 20.

The digital signal from the converter 16 is simultaneously presented to the upper peak comparator logic circuit 22 and to the lower peak comparator logic circuit 24, as shown. A digital signal from the upper peak digital storage circuit 18 is also presented to the upper peak comparator logic circuit 22 at this time, and a digital signal from the lower peak digital storage circuit 20 is presented to the lower peak comparator logic circuit 24.

If the current signal from the converter 16 is indicated to be larger than the signal from the storage circuit 18 by the comparator circuit 22, a signal on conductor 26 will be provided to the latch control circuit 28 which will subsequently cause the current digital signal from the converter 16 to replace the previously stored digital signal in the upper peak digital storage circuit 18.

Similarly, if the output signal from the lower peak comparator logic circuit 24 indicates that the current digital signal from the converter 16 has an absolute value larger than the digital signal stored in the lower peak digital storage circuit 20, an output will be provided on the conductor 30 to the upper and lower peak latch control logic circuit 28 which will subsequently provide an output signal to the lower peak digital storage circuit 20 to cause the current digital signal from the converter 16 to be stored in the storage circuit 20.

The conversion, comparison and replacement of the stored digital signals is continuous in the peak detector structure 10 and is controlled by the timing control circuit 32. Thus, initially the timing control circuit 32 provides a waiting pulse so that the comparator circuits 22 and 24 have time to complete the comparison of the signal from the converter 16 with the signals from storage circuits 18 and 20. Subseqently, the timing circuit 32 provides a pulse, after which the current digital signal may be stored in the storage circuits 18 and 20, if required, which pulse is followed by a safety wait pulse to ensure storing of the current digital signal and a subsequent pulse to tell the converter 16 to start the conversion, comparison and storage cycle anew.

The peak detector as shown in FIG. 1 is operable in either a manual or automatic mode. In the automatic mode, the clock control circuit 34 may initiate a signal which will cause the storage circuits 18 and 20 to be reset at predetermined intervals which may be varied as, for example, up to 15 seconds. In the manual mode of operation, the upper and lower peaks may be reset separately, manually, by the upper or lower reset logic circuit 36. Alternatively, the circuit 10 may be reset by computer logic over conductor 38.

The output of the peak detector circuit 10 may be an analog signal on conductors 40 and 42 direct from the digital to analog converter circuits 44 and 46, respectively. Alternatively, the output signal may be a digital signal through the digital meter assemblies 48 and 50. When the output signal is a digital display, standard engineering units may be selected and read directly from the digital meter assemblies. Output data buffering for direct connection to a computer complex is also provided by the output data circuits 52 and 54.

It will also be noted that the analog input signal may be passed directly to the digital output meter 48 over conductor 56, if desired. Also, a direct current signal may be fed directly to the digital output meter 50 over conductor 58 so that the peak detector structure 10 may be used directly as a volt meter which will provide a digital display in standard engineering units.

Figure 4A:
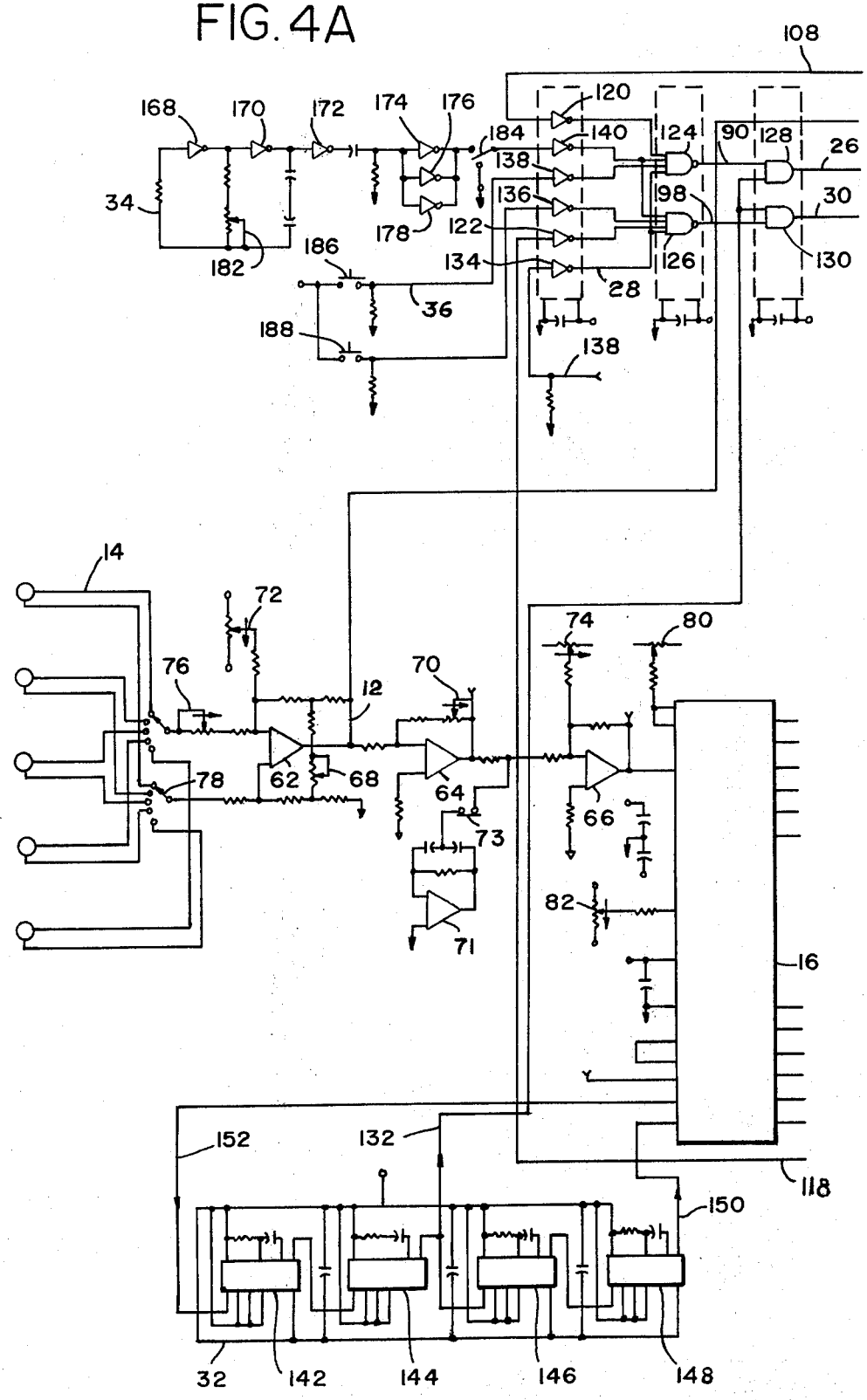
FIGS. 4A, 4B and 4C are a partly schematic, partly block diagram of the peak detector structure of the invention.
Figure 4B:
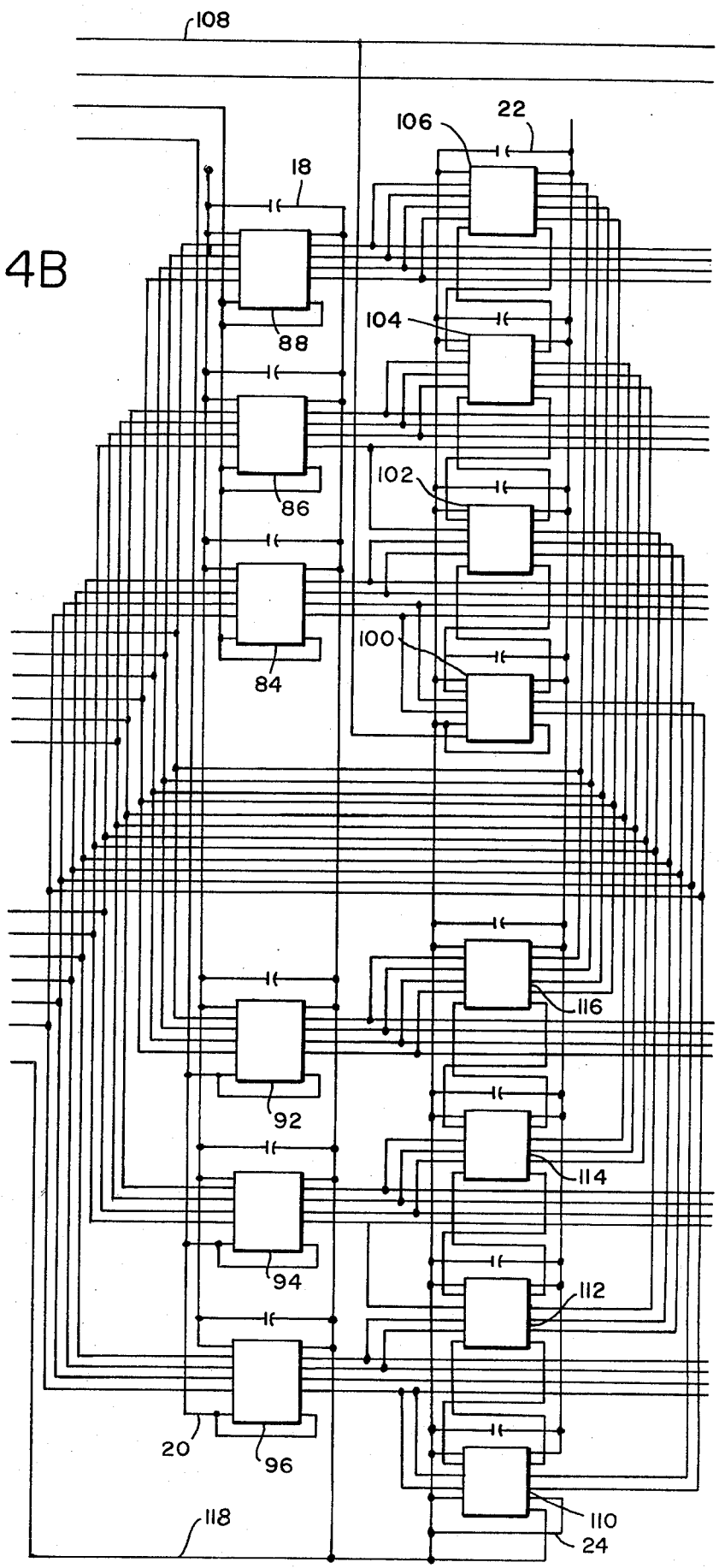
Figure 4C:
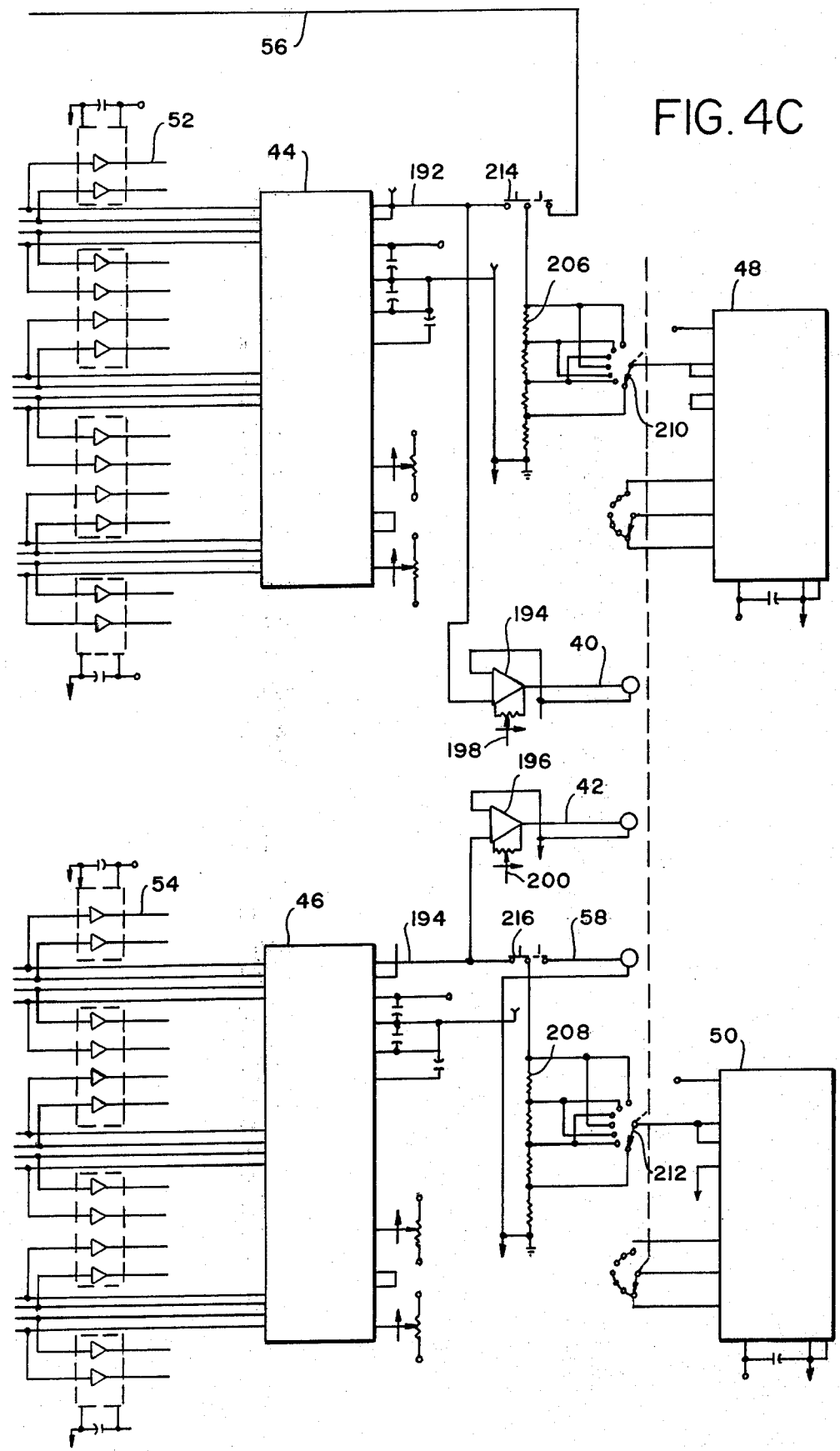

As shown in more detail in FIGS. 4A, 4B and 4C, the analog input signal processing circuit 12 includes operational amplifiers 62, 64 and 66. The amplifiers 62 and 66 each include balance potentiometers 72 and 74. In addition, the amplifiers 62 and 64 include the variable gain circuits 68 and 70. A common mode rejection ratio potentiometer 76 is provided in the circuit of the operational amplifier 62.

The analog signal circuit 12 further includes an active filter circuit 71 which is a thousand cycle filter and which may be placed in the input circuit by means of the filter in/out switch 73, as desired. The filter circuit is intended to filter out components of the input signal which are above 1,000 cycles per second to prevent erroneous peak detection due to transient conditions.

As shown, the input to the analog signal circuit 12 may be selected by the five-position selector switch 78 whereby an analog input may be provided to the operational amplifier 62 over any of the five input conductors 14.

The analog to digital converter circuit 16 includes a zero adjustment 80 and a gain adjustment 82. The analog to digital converter 16 is a purchased item and may be obtained from Analog Devices Corporation, Industrial Park, Norwood, Massachusetts, as their ADC 12 QZ model. The analog to digital converter 16 functions to continuously convert whatever analog signal is provided at its input from the operational amplifier 66 into a 12-bit output over the twelve output conductors indicated. Since such devices are known in the art and may be purchased off the shelf, the analog to digital converter 16 will not be considered in detail herein.

The upper peak digital storage circuit 18, as shown in more detail in FIG. 4B, includes three separate quad latch circuits 84, 86 and 88. The quad latch circuits 84, 86 and 88 are 4-bit storage elements utilizing latch connected gates to perform a memory function. Such quad latch circuits are again available on the open market as, for example, from the National Semiconductor Corporation, 2900 Semiconductor Drive, Santa Clara, California, as Model DM 7475. The quad latch circuits function to store digital information latched into the circuit on receipt of a latching signal over conductor 26. Thus, on receipt of a latching signal on the conductor 26, the latching circuits 84, 86 and 88 will substitute the signal on the twelve output conductors from the converter 16 to which they are connected into the quad latch circuits with four significant bits going into each latching circuit as shown.

Similarly, three latching circuits 92, 94 and 96 make up the lower peak digital storage circuit 20. These latching circuits are again the Model DM 7475 circuits from the National Semiconductor Corporation, and they serve to substitute the 12-bit output from the comparator 16 in place of the digital bits previously stored in the latching circuits 92, 94 and 96 on receipt of a latching signal over the conductor 30.

The upper peak comparator circuit 22 includes four separate 4-bit comparator circuits 100, 102, 104 and 106, which again may be purchased from the National Semiconductor Corporation as their Model DM 8200 4-bit comparator. The comparator circuits 100, 102, 104 and 106 compare the digital signal stored in the storage circuit 18 with the digital bits directly from the converter 16 and provide an output over conductor 108 when the digital signal from the converter 16 is larger than the digital signal from the storage circuit 18.

Similarly, the lower peak comparator logic circuit 24 includes four 4-bit comparator circuits 110, 112, 114 and 116 which are the Model DM 8200 4-bit comparator circuits of the National Semiconductor Corporation. The circuits 110, 112, 114 and 116 compare the digital signals in the storage circuit 20 with the current digital signal from the converter 16 and provide an output on the conductor 118 when the signal from the converter 16 is less than the signal from the storage circuit 20.

The signals from the conductors 108 and 118 are passed through the Hex inverter circuits 120 and 122, respectively, to the NAND gates 124 and 126 and are subsequently passed through the AND gates 128 and 130 to cause latching of the storage and latching circuits 84, 86 and 88 and 92, 94 and 96, respectively, under control of a gating signal on conductor 132 from the timing control circuit 32.

The inverters 120 and 122 along with inverters 134, 136, 138 and 140, may be purchased as a single integrated circuit from National Semiconductor Corporation as their Model DM 7404 Hex inverter. NAND gates 124 and 126 may be purchased from the same source as their Model DM 7420 dual 4-input NAND gate, and the AND gates 128 and 130 may also be purchased from National Semiconductor Corporation as their Model DM 7408 Quad 2-input AND gate. Since these circuits are known and are off-the-shelf purchase items, they will not be considered in further detail herein.

The timing circuit 32, as shown, includes four retriggerable monostable multivibrator circuits 142, 144, 146 and 148. This circuit serves to provide an output on conductors 132 and 150 at predetermined times after a signal is received by the timing circuit 32 over conductor 152 from the converter circuit 16. The signal outputs from the timing circuit 32 serve to time the operation of the converter 16, the storage circuits 18 and 20, and the comparator circuits 22 and 24.

Figure 5:
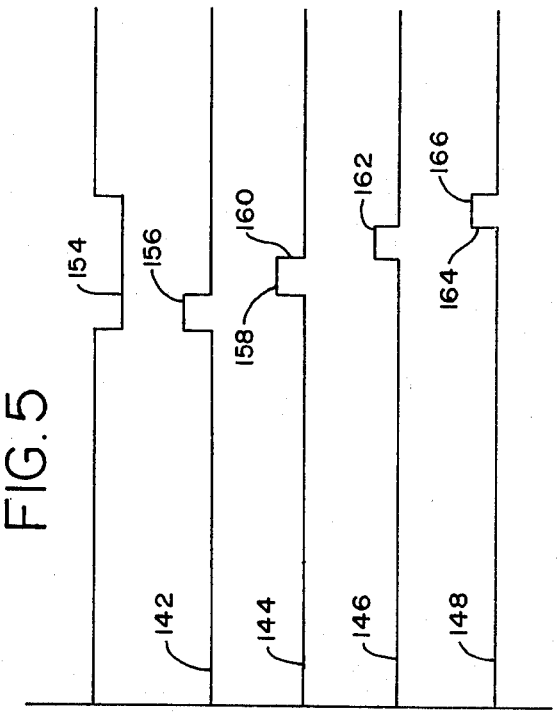
FIG. 5 is a chart showing the relative timing of the operations of the peak detector structure.

Thus, as shown best in FIG. 5, during a selected time of, for example, 40 microseconds, the circuit 142 provides a first pulse of a predetermined duration which provides sufficient time to permit the comparator circuits 22 and 24 to compare the digital numbers from the converter 16 and the storage circuits 18 and 20. The multivibrator 144 then provides a delay time during which the circuit becomes stable so that on the trailing edge 160 of the pulse 158, a signal is provided on the conductor 132 which goes to the AND gates 128 and 130 to cause them to provide a signal on the conductors 26 and 30 in accordance with the signal on the conductors 90 and 98 from the NAND gates 124 and 126. The multivibrator 146 then provides a safety wait pulse 162 to again allow the circuit to become stabilized, and then on the leading edge 164 of the pulse 166 from multivibrator 148, the converter 16 is again actuated to convert the incoming signal from the selected conductor 14 into a digital signal.

The clock control circuit 34, as shown, includes a plurality of circuits 168, 170, 172, 174, 176 and 178 which again are provided in a single integrated circuit which may be purchased from the Radio Corporation of America as their Hex buffer converter Model CD 4049A. As shown, the Hex buffer converter will automatically provide a pulse output on conductor 180 at a rate determined by the setting of the rate potentiometer 182. Thus, when the switch 184 is in the automatic position as shown, the inverter 140 is provided with a pulse signal at predetermined intervals which may be up to 15 seconds but which may be made longer, if desired, to provide a simultaneous input to both of the NAND gates 124 and 126 whereby the AND gates 128 and 130 may be actuated to provide output signals on the conductors 26 and 30. Since pulsing circuits such as the clock control circuit 34 are known and may be purchased off the shelf as indicated above, this circuit will not be considered further in detail herein.

The upper or lower reset logic circuit 36, as shown, includes an upper reset push button 186 and a lower reset push button 188. The push buttons are connected to a common input power supply across load resistors so that on pressing push buttons 186 and 188, a signal is sent to the inverters 138 and 136, respectively, to again actuate the NAND gates 124 and 126 and thus place the AND gates 128 and 130 in condition to provide a signal on conductors 26 and 30 on receipt of a pulse from the timing circuit 32.

The inverter 134 is connected across a load resistor to a computer conductor 138 so that the peak detection circuit 10 can be reset by a computer signal received over the conductor 138.

The output of the peak detection circuit 10, as shown, may take a plurality of different forms. Directly from the digital storage circuits 18 and 20, the digital signals are fed into digital to analog converters 44 and 46. The digital to analog converters 44 and 46 are Analog Devices Corporation Model DAC 12 QZ converters and take a 12-bit digital signal and convert it into an analog signal on the output conductors 192 and 194. As shown, the analog outputs may be taken out through the operational amplifier 194 and conductor 40 for the upper peak and amplifier 196 and conductor 42 for the lower peak. The operational amplifiers 194 and 196 again include balance control structure 198 and 200. An upper peak analog output is provided on the conductor 40 and a lower peak analog output is provided on conductor 42.

The analog signal outputs are also fed across voltage dividers 206 and 208 through the 8-position switches 210 and 212 to the digital display meter assemblies 48 and 50. The voltage dividers 206 and 208 are such that in different positions of the switches 210 and 212, the output of the digital meter assemblies will read directly in standard engineering units.

Again, the digital display meters for the upper and lower peaks are well known in the art and are standard off-the-shelf items and therefore will not be considered further in detail herein.

The switch 214 between the digital to analog converter 44 and the voltage divider 206 is provided to connect the input analog signal from the operational amplifier 62 directly to the divider 206 and thus to the digital meter assembly 48. Thus, when it is desired, the input analog signal may be read directly in terms of a digital output display.

A similar switch 216 connected between the digital to analog converter 46 and the voltage divider 208 permits the use of the peak detector circuit 10 and in particular the lower peak digital display meter 50 as a volt meter with a direct current input over conductor 58. When in use as a volt meter, the voltage may again be read in terms of standard engineering units on the meter 50.

Thus, in overall operation of the peak detection circuit 10, an analog input signal is selected from one of the conductors 14 by means of the switch 78 and is amplified through the amplifiers 62, 64 and 66 and filtered, if desired, through the active filter circuit 71, after which the analog signal is placed into the analog to digital converter 16.

The analog signal is then converted into a 12-bit digital signal and is presented to the upper and lower peak comparators for comparison with digital signals currently latched into the upper peak storage circuit and lower peak storage circuit 18 and 20, respectively.

The timing circuit provides a waiting time to permit the comparator circuits to become stable and on a signal being provided from the conductor 132 to the AND gates 128 and 130, the digital signal currently at the converter will be substituted for the digital signals in the storage circuits 18 and 20 provided a signal is provided on the conductors 108 or 118 indicating that the signal currently at the converter is either an upper or lower peak.

A current signal at the converter may also be placed in the storage circuits 18 and 20 automatically and periodically due to the operation of the clock control circuit 34 in the automatic mode of operation of the peak detector. In such case, the NAND gates 124 and 126 are energized through the inverter 140.

Alternatively, in a manual mode of operation; that is, when the switch 184 is turned to the manual position, the peak detection circuit may be reset at manually selected times with the upper and lower peaks reset individually by means of pressing the push buttons 186 and 188, respectively. A resetting signal may also be provided for the upper and lower peaks by means of a computer signal on the conductor 138, as previously indicated.

In any event, the digital storage circuits 18 and 20 have stored in them the digital signal representative of the analog upper and lower peaks, respectively, which have occurred since the last resetting of the storage circuits 18 and 20, either automatically or manually, either by hand or by a computer input signal.

The stored upper and lower peak digital signals are then again converted in the digital to analog converter circuits 44 and 46 and may be provided as an output in either analog or digital form. Again, wherein a digital display of the peak signals is provided, the display may be directly in standard engineering units accomplished by means of selecting the predetermined units with the switches 210 and 212.

Also as indicated before, on movement of the switch 214 to the right as shown in FIG. 4C, the digital meter 48 may be used to provide an output signal representing the input analog signal. Similarly, the lower digital display meter 50 may be used as a volt meter for a direct current input signal to the conductor 58 with switch 216 moved to the right.

While one embodiment of the present invention has been disclosed in detail, other embodiments and modifications thereof are contemplated. It is the intention to include all such embodiments and modifications as are defined by the appended claims within the scope of the invention.

What I claim as my invention is:

1. Structure for substantially instantaneously detecting a peak in an analog electrical signal comprising analog to digital converter means for substantially instantaneously developing current digital signals representative of the current value of the analog electrical signal, storage means for storing a digital signal representative of a previous peak in the analog signal connected to the analog to digital converter means, comparator means for substantially instantaneously comparing each current digital signal with the stored digital signal connected to the converter and comparator, peak latch control logic means for substantially instantaneously replacing the stored digital signal in the storage means with each developed current digital signal having a predetermined relation to a stored digital signal to provide a new stored digital signal connected to the comparator means and storage means and timing means connected to the comparator and to the peak latch control logic means for cyclically providing a first pulse of duration sufficient to permit the comparator to compare the stored and current digital signals, a second delay pulse immediately following the first pulse to permit the structure to become electrically stable, the trailing edge of which permits operation of the peak latch control means, a third pulse immediately following the second pulse for providing a safety wait time delay to allow the structure to again become electrically stable after operation of the peak latch control logic means, and a fourth pulse immediately following the third pulse on the leading edge of which the converter is actuated and the timing cycle is re-started.

2. Structure as set forth in claim 1 including means for storing a digital signal representative of both the positive and negative peak of the analog signal and for comparing both the stored digital signals with the currently developed digital signals whereby both positive and negative peaks may be detected.

3. Structure as set forth in claim 1 and further including means for automatic and manual resetting of the peak detector structure.

4. Structure as set forth in claim 1 and further including means for providing a readout of the stored signal in both a digital and analog mode.

5. Structure as set forth in claim 4 and fruther including means for providing the readout in the digital mode directly in a plurality of standard units.

6. Structure as set forth in claim 1 and further including means for directly reading out the input signal from which the digital signal is developed.

7. Structure as set forth in claim 1 and further including means for using the peak detector as a volt meter.

8. The method of detecting peaks in an analog signal comprising periodically substantially instantaneously converting the analog signal to a digital signal, storing the digital signal, substantially instantaneously comparing each subsequent conversion of the analog signal into a digital signal with the stored digital signal, delaying replacing the stored digital signal with a subsequent digital signal of greater absolute value for a first time sufficient to complete the comparing and for a second time sufficient for the peak detecting structure to become stable and then substantially instantaneously replacing the stored digital signal with a subsequent digital signal when the subsequent digital signal is of greater absolute value than the stored digital signal and then providing a safety time delay to again allow the peak detecting structure to become stable and subsequently again converting the analog signal to a digital signal to start a new cycle of peak detecting.

9. The method as set forth in claim 8 and further including storing digital signals representing both the positive and negative peaks of the analog signal and comparing the stored digital signals with the developed digital signals and replacing the stored digital signals with the developed digital signals when either a positive or negative developed digital signal is greater than the similar stored digital signal.

* * * * *